(12) United States Patent
Kern et al.

(10) Patent No.: US 9,460,759 B2
(45) Date of Patent: Oct. 4, 2016

(54) SENSE AMPLIFIER OF A MEMORY CELL

(71) Applicant: Infineon Technologies AG, Neubiberg (DE)

(72) Inventors: Thomas Kern, Munich (DE); Mihail Jefremow, Augsburg (DE)

(73) Assignee: Infineon Technologies AG, Neubiberg (DE)

(*) Notice: Subject to any disclaimer, the term of this patent is extended or adjusted under 35 U.S.C. 154(b) by 60 days.

(21) Appl. No.: 14/149,353

(22) Filed: Jan. 7, 2014

(65) Prior Publication Data

US 2015/0194192 A1    Jul. 9, 2015

(51) Int. Cl.
*G11C 7/12* (2006.01)
*G11C 7/06* (2006.01)
*G11C 11/16* (2006.01)
*G11C 13/00* (2006.01)
*G11C 16/26* (2006.01)

(52) U.S. Cl.
CPC ............... *G11C 7/062* (2013.01); *G11C 7/12* (2013.01); *G11C 11/1673* (2013.01); *G11C 13/004* (2013.01); *G11C 16/26* (2013.01)

(58) Field of Classification Search
CPC ........................................ G11C 7/12
USPC ........................................ 365/205
See application file for complete search history.

(56) References Cited

U.S. PATENT DOCUMENTS

| 2003/0021160 A1 | 1/2003 | Covarel et al. |
| 2003/0043616 A1 | 3/2003 | Baker |
| 2006/0072358 A1* | 4/2006 | Kang et al. ................. 365/185.2 |
| 2007/0008779 A1* | 1/2007 | Isobe ...................... G11C 5/147 365/185.18 |
| 2009/0219757 A1 | 9/2009 | Furuta et al. |
| 2010/0027353 A1* | 2/2010 | Kwon ....................... 365/185.33 |
| 2013/0107603 A1* | 5/2013 | Huang et al. .................. 365/96 |

FOREIGN PATENT DOCUMENTS

| JP | H11-259155 A | 9/1999 |
| JP | 2009-211733 A | 9/2009 |

OTHER PUBLICATIONS

Office Action dated Feb. 10, 2016 for Japanese Patent Application No. 2014-259237.

* cited by examiner

*Primary Examiner* — Min Huang

(74) *Attorney, Agent, or Firm* — Schiff Hardin LLP

(57) ABSTRACT

A sense amplifier of a memory cell having a sense voltage generating circuit configured to generate a sense voltage; and a sensing circuit configured to compare a bitline voltage of the memory cell with the sense voltage, and to output a digital output signal indicating a content of the memory cell, wherein during a sense phase, the sensing circuit is decoupled from a voltage supply which charges a bitline capacitance during a precharge phase, and is coupled to and supplied by the bitline capacitance. The sense voltage generating circuit may be further configured to generate a sense voltage that during a precharge phase is dependent on the voltage supply and during a sense phase is independent of the voltage supply.

12 Claims, 6 Drawing Sheets

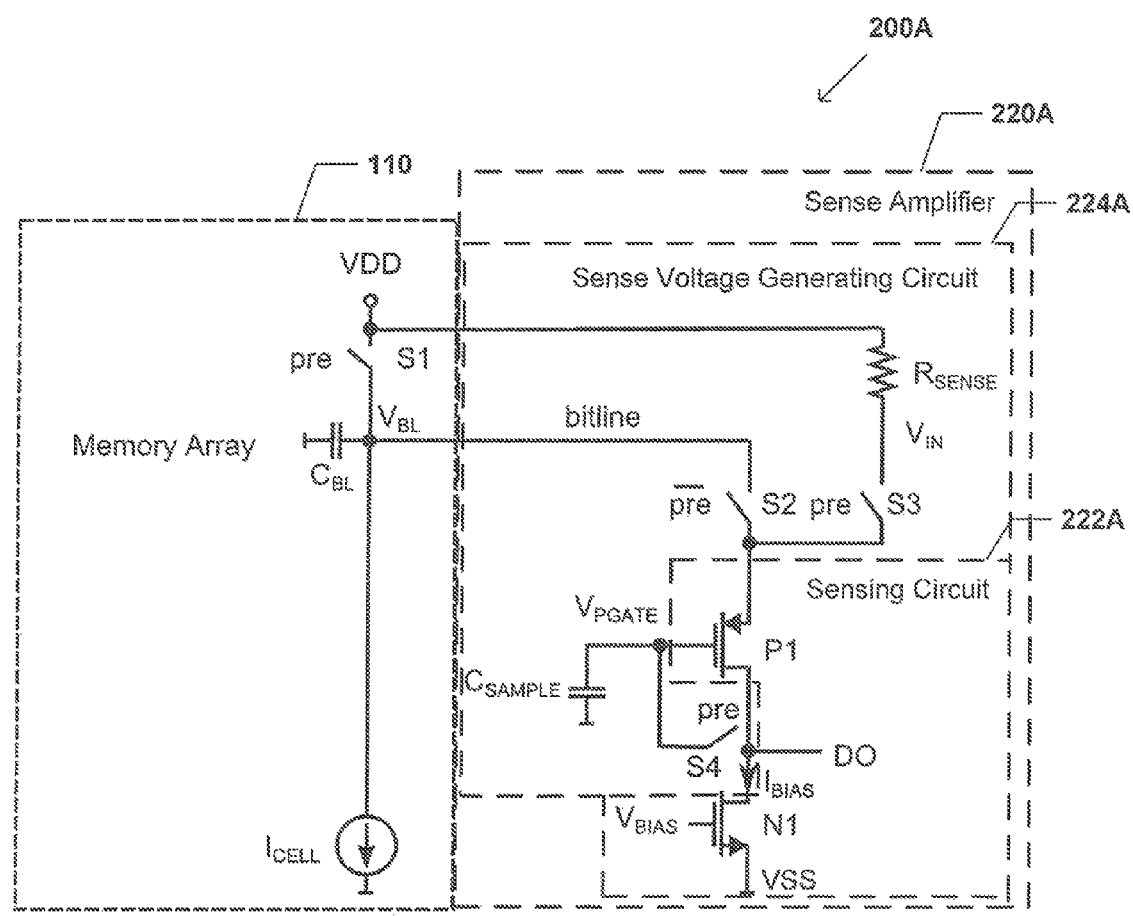

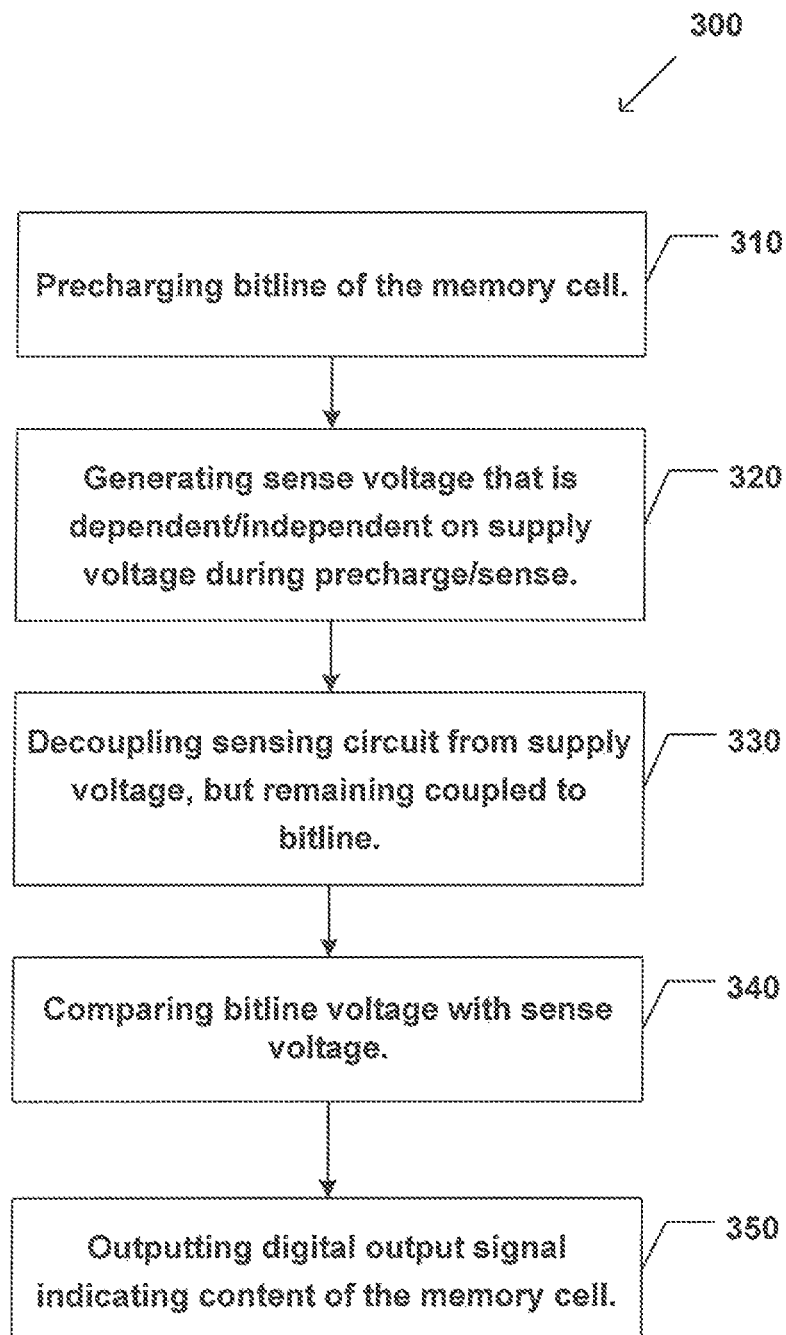

SENSE AMPLIFIER OF A MEMORY CELL

BACKGROUND

A sense amplifier is a circuit that reads data from a memory cell of a memory array. The sense amplifier senses low voltage signals from a bitline representing a data bit ("1" or "0") stored in the memory cell, and amplifies the low voltage signals to full CMOS-level voltage signals for digital post processing.

A reading operation by a sense amplifier is triggered by a memory address change or a dedicated read start and has two phases—a precharge phase and a sense phase. During the precharge phase the bitline capacitance is charged to precharge potential VDDpre. In the subsequent sense phase, the bitline is discharged by the memory cell current towards voltage source VSS (e.g., ground). The sense amplifier acts as a voltage comparator comparing a sense voltage (i.e., reference voltage) with the voltage on the bitline. When a low resistive cell is accessed (data bit '0'), the bitline is discharged faster as compared with a bitline discharge corresponding to a high resistive cell (data bit '1'). The sense amplifier's digital output signal changes to a logic "0" when the bitline voltage becomes less than the sense voltage.

A sense amplifier's power consumption should be as low as possible in order to achieve targets for ultra-low power applications. There are features of sense amplifiers of previous approaches that detract from this goal.

For instance, a sense amplifier is continuously biased from a global voltage supply, thereby consuming static and dynamic power. Further, the sense amplifier may be biased during the sense phase by voltage supply VDD. Also, the bitline is typically precharged from a regulated supply VDDpre, thereby requiring additional circuitry and current.

Even further, good power supply rejection ratios typically require voltage regulation for the bitline voltage or the sense amplifier itself, increasing power consumption further. In addition, the maximum bitline voltage is limited by the voltage headroom required by the voltage regulation.

BRIEF DESCRIPTION OF THE DRAWINGS

FIGS. 2A, 2C and 2D illustrate circuit diagrams of a memory array coupled to a sense amplifier in accordance with another exemplary embodiment.

FIG. 3 illustrates a flowchart of a method in accordance with an exemplary embodiment.

DETAILED DESCRIPTION

The present disclosure is directed to a sense amplifier of a memory cell having a sense voltage generating circuit configured to generate a sense voltage; and a sensing circuit configured to compare a bitline voltage of the memory cell with the sense voltage, and to output a digital output signal indicating a content of the memory cell, wherein during a sense phase, the sensing circuit is decoupled from a voltage supply which charges a bitline capacitance during a precharge phase, and is coupled to and supplied by the bitline capacitance. The sense voltage generating circuit may be further configured to generate a sense voltage that during a precharge phase is dependent on the voltage supply and during a sense phase is independent of the voltage supply. Such a sense amplifier is advantageous in that it has lower power consumption and good power supply rejection as compared with previous approaches.

Figure 1A:
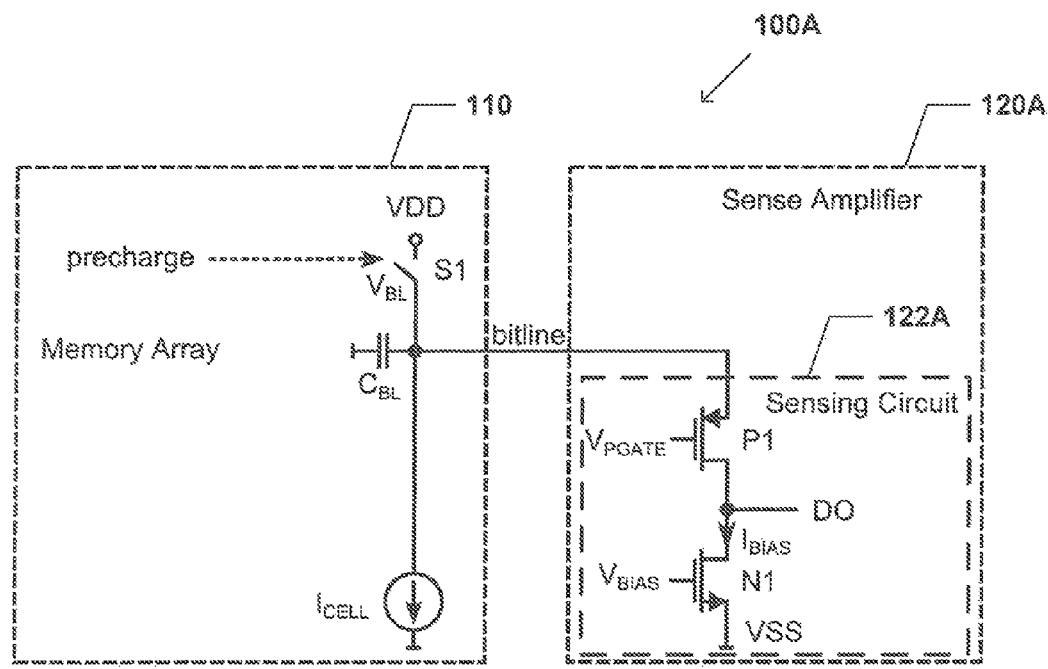
FIG. 1A illustrates a circuit diagram of a memory array coupled to a sense amplifier in accordance with an exemplary embodiment.
Figure 1B:
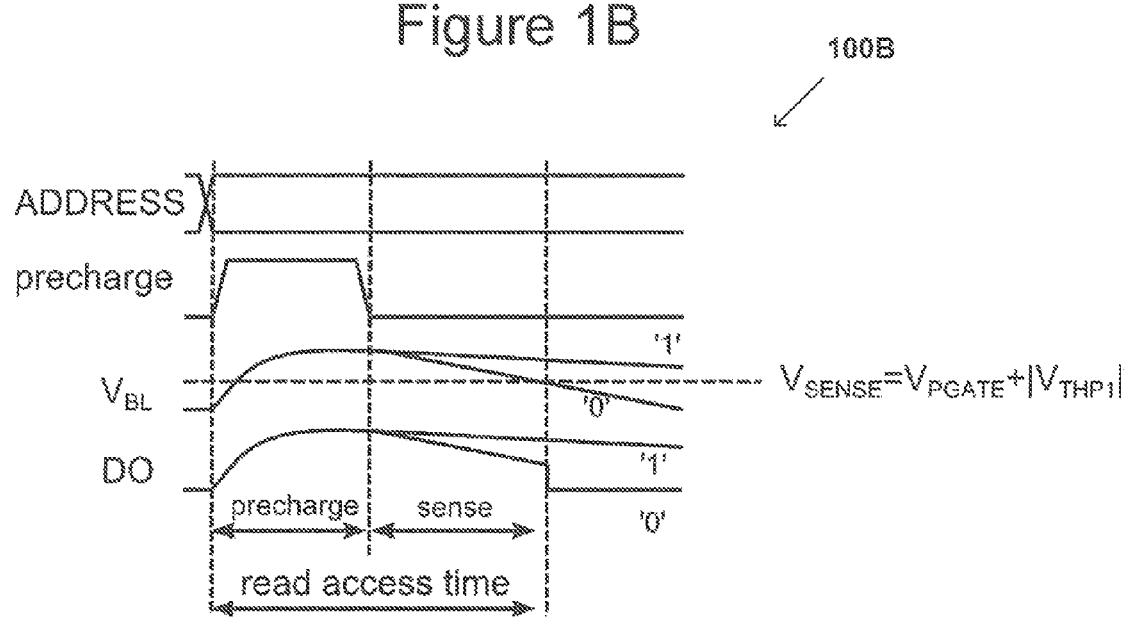
FIG. 1B illustrates a timing diagram of the circuit of FIG. 1A.

FIG. 1A illustrates a circuit diagram 100A of memory array 110 coupled to sense amplifier 120A in accordance with an exemplary embodiment. FIG. 1B illustrates a timing diagram 100B of the circuit of FIG. 1A.

Memory array 110 comprises a memory cell represented at the bitline, and switch S1 coupled between voltage supply VDD and the bitline. The bitline has a capacitance represented as $C_{BL}$ and a current represented as $I_{CELL}$.

Sense amplifier 120A comprises sensing circuit 122A, along with other elements not shown for the sake of simplicity. Sensing circuit 122A is based on two transistors—p-channel metal oxide semiconductor field effect transistor (PMOS) P1 and n-channel metal oxide semiconductor field effect transistor (NMOS) N1. PMOS P1 is coupled between the bitline and digital output DO, and functions as a voltage detector. NMOS N1 is coupled between the digital output DO and voltage source VSS (e.g., ground) and functions as a current source generating bias current $I_{BIAS}$.

A reading operation by sense amplifier 120A is triggered by a memory address change and has two phases—a precharge phase and a subsequent sense phase. FIG. 1B shows this memory address change in the upper-most row of the timing diagram, and the precharge phase in the second row.

During the precharge phase, switch S1 is conducting to charge the bitline directly to supply potential VDD, as shown in the third row of FIG. 1B. The preregulated bitline voltage VDDpre of previous approaches is skipped, thereby saving power and not requiring any additional circuitry or current for bitline regulation.

During the subsequent sense phase, sensing circuit 122A is decoupled from voltage supply VDD by open switch S1, and remains coupled to the bitline to be supplied directly from bitline voltage $V_{BL}$ rather than from a global power supply as in previous approaches. In other words, sense amplifier 120A reuses the bitline charge for its sense operation. Sensing circuit 122A compares bitline voltage $V_{BL}$ of the memory cell with sense voltage $V_{SENSE}$, and outputs a digital output signal at digital output DO indicating a content of the memory cell, as shown in the third and fourth rows of FIG. 1B. Sense voltage $V_{SENSE}$ is the sum of the gate voltage and absolute value of the threshold voltage of transistor P1 ($V_{SENSE} = V_{PGATE} + |V_{THP1}|$).

More specifically, during the sense phase the precharged bitline capacitance $C_{BL}$ is discharged by cell current $I_{CELL}$. Also, current discharges through PMOS P1 and NMOS N1, which determines digital output signal DO indicating a content of the memory cell. PMOS P1 charges from the bitline capacitance $C_{BL}$ to the digital output DO as long as bitline voltage $V_{BL}$ is greater than sense voltage $V_{SENSE}$, and NMOS N1 discharges the digital output DO to voltage source VSS when bitline voltage $V_{BL}$ becomes less than sense voltage $V_{SENSE}$. In other words, when bitline voltage $V_{BL}$ reaches sense voltage $V_{SENSE}$, the difference between gate voltage $V_{PGATE}$ and bitline voltage $V_{BL}$ becomes lower than the PMOS threshold voltage $V_{THP1}$, and PMOS P1 is turned off. If PMOS P1 is off, and there is still current through NMOS N1, digital output DO is discharged to VSS (e.g., ground) with bias current $I_{BIAS}$. The discharge speed of digital output DO is fast compared to the discharge speed of bitline capacitor $C_{BL}$ since digital output DO has only a small parasitic capacitance; this is represented by the sudden drop in the digital output signal at digital output DO when bitline voltage $V_{BL}$ crosses sense voltage $V_{SENSE}$. If bitline voltage $V_{BL}$ remains greater than sense voltage $V_{SENSE}$, the memory cell is considered to be written (logic "1"). On the other hand, if bitline voltage $V_{BL}$ of the memory cell becomes less than sense voltage $V_{SENSE}$, the memory cell is considered to be erased (logic "0").

Therefore, similar to previous approaches, bitline capacitance $C_{BL}$ is charged (i.e., switch S1 is conducting) during the precharge phase to voltage supply VDD, and is discharged (i.e., S1 is non-conducting) in the subsequent sense phase. However, during a sense phase, sensing circuit 120A is decoupled from voltage supply VDD and is coupled to and supplied by bitline voltage $V_{BL}$. The power consumption of sense amplifier 120A after the precharge phase is finished becomes zero since there is no current path from voltage supply VDD to voltage source VSS.

Memory array 110 illustrates a single memory cell for the sake of simplicity. It is well known that memory array 110 may include any number of memory cells suitable for the intended purpose. Also, voltage sense amplifier 120A is illustrated as coupled to reading this single memory cell. Depending on the type of memory array, one voltage sense amplifier 120A may be coupled via a multiplexer circuit to read any number of memory cells as suitable for the intended purpose.

Also, the memory array may be any known volatile or non-volatile memory. Examples of memory array types include but are not limited to ROM, PCRAM (phase change RAM), CBRAM (conductive bridging), and MRAM (magnetoresistive memory), etc.

Figure 2B:
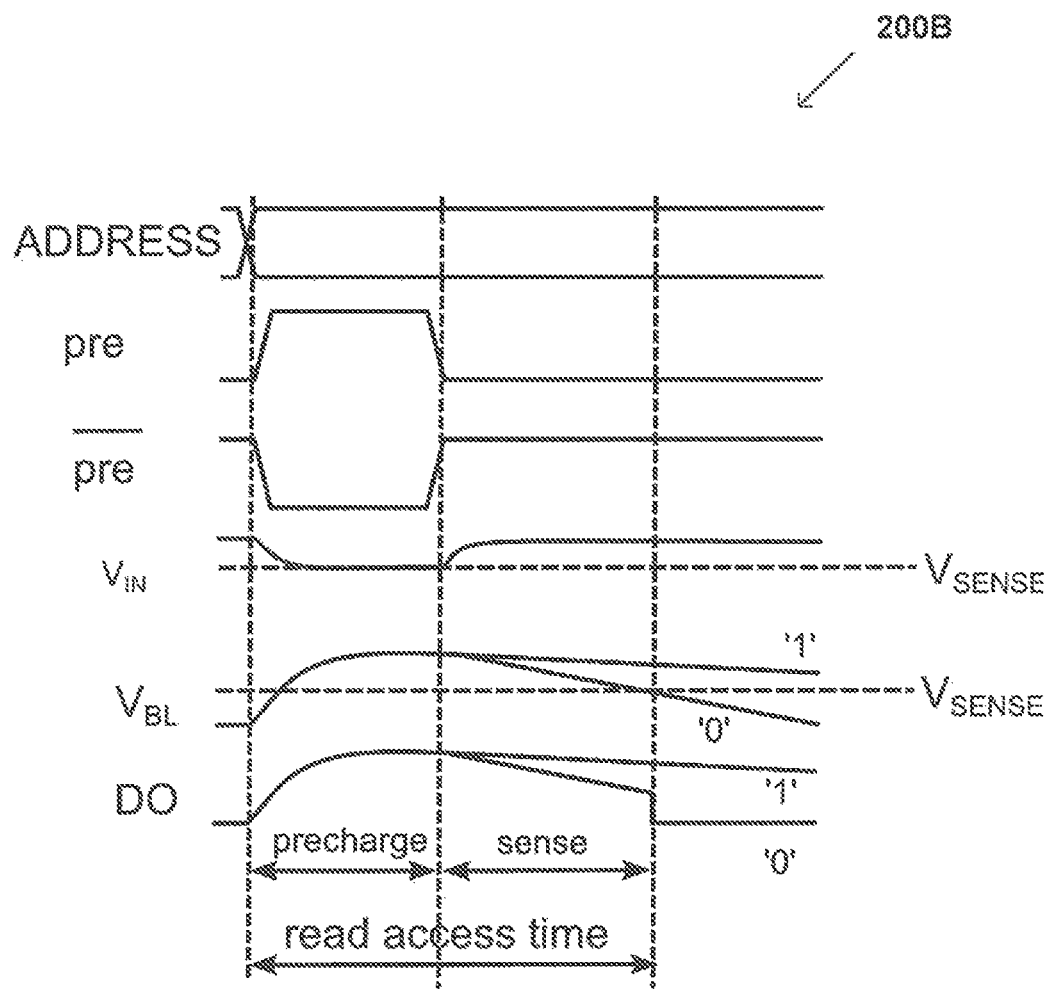
FIG. 2B illustrates a timing diagram of the circuit of FIGS. 2A, 2C and 2D.
Figure 2C:
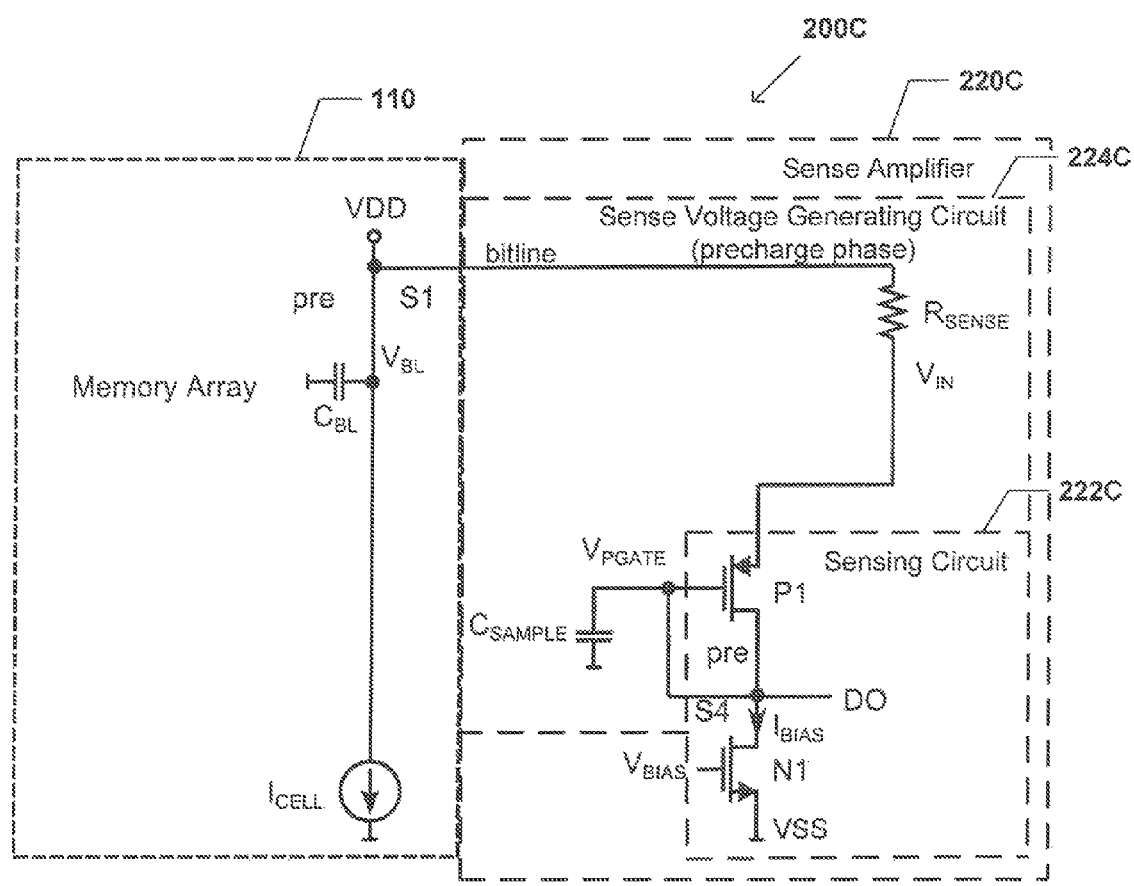
Figure 2D:
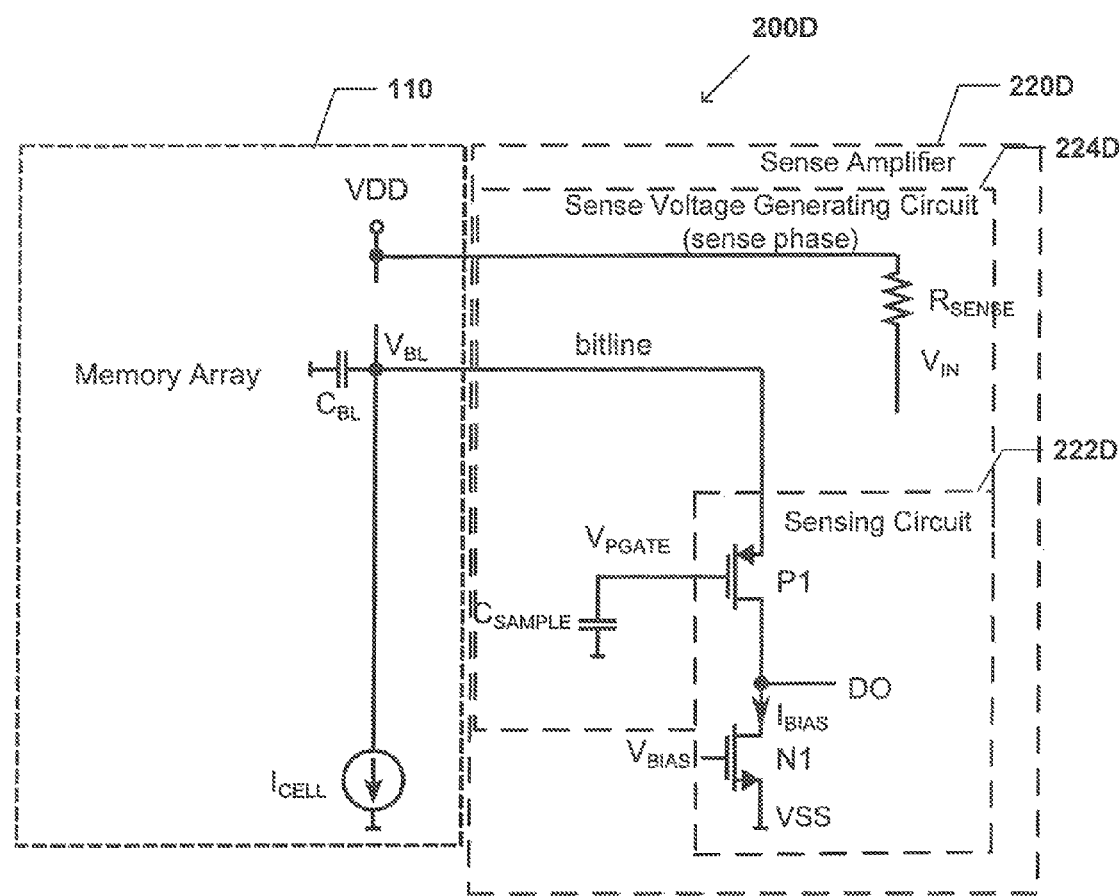

FIGS. 2A, 2C and 2D illustrate circuit diagrams of memory array 110 coupled to sense amplifier 220 having a sense voltage generating circuit 224 generating a local sense voltage $V_{SENSE}$ in accordance with an exemplary embodiment. More specifically, FIG. 2A illustrates sense voltage generating circuit 224A in general, FIG. 2C illustrates sense voltage generating circuit 224C during the precharge phase, and FIG. 2D illustrates sense voltage generating circuit 224D during the sense phase. FIG. 2B illustrates a timing diagram 200B of the sense amplifiers 220 of FIGS. 2A, 2C and 2D.

Referring first to FIG. 2A, illustrated is a circuit diagram 200A of memory array 110 coupled to sense amplifier 220A.

Memory array 110 is the same memory array illustrated in FIG. 1A, and for the sake of brevity, its description is not repeated here.

Sense amplifier 220A comprises sensing circuit 222A and sense voltage generating circuit 224A. Sensing circuit 222A was described above with respect to FIG. 1A, and for the sake of brevity, its description is not repeated here.

Sense voltage generating circuit 224A is a local circuit replacing the previous approaches of a global sense voltage generating circuit which generates the PMOS gate voltage $V_{PGATE}$ for all of the sense amplifiers of a memory array. The local sense voltage generating circuit 224A of the present disclosure is realized by three additional switches S2-S4, sample capacitance $C_{SAMPLE}$ and sense resistor $R_{SENSE}$. The switches allow sense voltage $V_{SENSE}$ to be dependent on voltage supply VDD during the precharge phase, and independent of voltage supply VDD during the sense phase, as will be described below in more detail with respect to FIGS. 2C and 2D, respectively.

More specifically, switch S2 is coupled between the bitline and the source of PMOS P1. Switch S3 is coupled between voltage supply VDD and the source of PMOS P1. Switch S4 is coupled between the gate of PMOS P1 and the drain of PMOS P1. Sense resistor $R_{SENSE}$ is coupled between voltage supply VDD and switch S3. Sample capacitor $C_{SAMPLE}$ is coupled between the gate of PMOS P1 and a stable voltage source (e.g., voltage source VSS), and during the sense phase, is configured to apply a voltage to $V_{PGATE}$ in order to keep $V_{PGATE}$ stable.

FIG. 2C is the circuit diagram of FIG. 2A illustrated in its precharge phase. As will be described, during the precharge phase, sense voltage generating circuit 224C is configured such that sense voltage $V_{SENSE}$ is dependent on voltage supply VDD.

During the precharge phase, switch S2 is configured to be open, and switches S3 and S4 are configured to be closed. Sensing circuit 222C is coupled to voltage supply VDD, and thus sense voltage $V_{SENSE}$ is dependent on voltage supply VDD.

The local sense voltage generating circuit 224C is advantageous over the global sense voltage generating circuit of previous approaches in that a local voltage supply VDD "bump" (i.e., sudden increase or decrease in voltage supply VDD) during the precharge phase does not disrupt the sensing operation during the sense phase due to sense voltage $V_{SENSE}$ being dependent on voltage supply VDD. The advantages of the local sense voltage generating circuit 224C are best highlighted with a description of the global sense generating circuit of the previous approaches.

The global sense generating circuits of the previous approaches do not have sense voltage $V_{SENSE}$ dependent on VDD. For example, a disruption in the sensing operation may occur if, during the precharge phase, there is a sudden change (e.g., decrease) in voltage supply VDD. More specifically, gate voltage $V_{PGATE}$ is fixed, so sense voltage $V_{SENSE}$, which is dependent on gate voltage $V_{GATE}$ ($V_{SENSE}=V_{PGATE}+|V_{THP1}|$) is also fixed. On the other hand, voltage supply VDD may increase and decrease due to noise and overall system behavior. A sudden decrease in voltage supply VDD, which charges the bitline capacitance $C_{BL}$ during the precharge phase, results in a decrease in the precharged bitline voltage $V_{BL}$. But again, sense voltage $V_{SENSE}$ is fixed. At the beginning of the sense phase, the decreased bitline voltage $V_{BL}$ may therefore already be below sense voltage $V_{SENSE}$. So when bitline voltage $V_{BL}$ decreases further during the discharge of the bitline, there is never a point where bitline voltage $V_{BL}$ can cross from being greater than the sense voltage $V_{SENSE}$ to being less than sense voltage $V_{SENSE}$ indicating an erased cell (logic "0"). There is no real sense phase because it is not possible in this situation to read the memory cell to sense between logic "0" and "1".

The sense voltage generating circuit 224C of the present disclosure does not suffer from the drawbacks of the global approach because sense voltage $V_{SENSE}$ is responsive to voltage supply VDD variations by taking into consideration any VDD bumps. If a voltage supply suddenly decreases, sense voltage $V_{SENSE}$ also decreases by a similar amount due to switch S3 being closed to couple PMOS P1 with voltage supply VDD, so that voltage supply VDD is not less than sense voltage $V_{SENSE}$.

Also, with the local sense voltage generation of the present disclosure, transistor mismatch of PMOS P1 due to manufacturing differences is cancelled out between sense amplifiers. More specifically, during the precharge phase PMOS P1 is in diode connection adjusting its gate potential $V_{PGATE}$ to be approximately sense voltage minus PMOS P1's threshold voltage ($V_{PGATE}=V_{SENSE}-|V_{THP1}|$). Sense voltage $V_{SENSE}$ is related to the local voltage supply VDD by $V_{SENSE}-V_{IN}=VDD-R_{SENSE}*I_{BIAS}$. $V_{PGATE}$ variations are avoided by PMOS P1 setting its own gate voltage $V_{PGATE}$ and using this same gate voltage $V_{PGATE}$ during the sensing phase.

FIG. 2D is the circuit diagram of FIG. 2A illustrated in its sense phase. As will be described, during the sense phase, sense voltage generating circuit 224A is configured such that sense voltage $V_{SENSE}$ is independent of voltage supply VDD, as opposed to during the precharge phase where sense voltage $V_{SENSE}$ is dependent on voltage supply VDD.

During the sense phase, switch S2 is configured to be closed, and switches S3 and S4 are configured to be open. Sensing circuit 222C is not coupled to voltage supply VDD, and thus the sense voltage Vsense is independent of VDD.

Also, during this sense phase bitline having a capacitance $C_{BL}$ is discharged at cell current $I_{CELL}$ plus the current flowing through transistor N1 (e.g., bias current $I_{BIAS}$). The sampled voltage in Csample is applied to the gate of PMOS P1. There is no current flow through $R_{SENSE}$.

The local sense voltage generating circuit 224D is advantageous over the global sense voltage generating circuit of previous approaches in that a local voltage supply VDD bump does not disrupt the sensing operation due to sense voltage $V_{SENSE}$ being independent on voltage supply VDD. If during the sense phase the sense voltage $V_{SENSE}$ were to remain dependent on voltage supply VDD as it is during the precharge phase, then a sudden increase, for example, in voltage supply VDD would necessarily result in an increase in sense voltage $V_{SENSE}$. Bitline voltage $V_{BL}$ would remain substantially at the same level as the bitline is no longer coupled with source voltage VDD due to switch S1 being open, and would already be below the sense voltage $V_{SENSE}$. Then, when bitline voltage $V_{BL}$ decreases during the sense phase, bitline voltage $V_{BL}$ would be less than sense voltage $V_{SENSE}$. There is never a point where bitline voltage $V_{BL}$ can cross from being greater than the sense voltage $V_{SENSE}$ to being less than sense voltage $V_{SENSE}$ indicating an erased cell (logic "0"). There is no real sense phase because it is not possible in this situation to read the memory cell to sense between logic "0" and "1". This does not happen with sense voltage generating circuit 224D of the present disclosure where during the sense phase sense voltage $V_{SENSE}$ is independent of voltage supply VDD.

FIG. 3 illustrates a flowchart of a method of reading a memory cell by a sense amplifier in accordance with an exemplary embodiment.

In Step 310, the bitline $C_{BL}$ of the memory cell is charged, during a precharge phase, by voltage supply VDD.

Next, Step 320, sense voltage generating circuit generates sense voltage $V_{SENSE}$. Sense voltage $V_{SENSE}$ is dependent on voltage supply VDD during the precharge phase and is independent of voltage supply VDD during the sense phase.

Step 330 begins the sense phase, during which sensing circuit 122A, 222A, 22B, 222C is decoupled from voltage supply VDD, but remains coupled to the bitline and supplied by bitline voltage $V_{BL}$.

In Step 340, sensing circuit compares bitline voltage $V_{BL}$ with sense voltage $V_{SENSE}$, and in Step 350 outputs at digital output signal at digital output DO indicating a content of the memory cell.

The sense amplifiers disclosed herein have been described as drain side sense amplifiers, but the disclosure is not limited in this respect. Alternatively, the sense amplifiers may be source side sense amplifiers.

Further, bipolar transistors (e.g., PNP or NPN) may be used instead of MOS transistors. A PNP may be used instead of NPN, and a PMOS may be used instead of NMOS. Accordingly, it is intended that the disclosure be limited only in terms of the appended claims. The systems described herein could be converted to equivalent digital logic functions and yet be within the scope of the disclosure.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present application. This application is intended to cover any adaptations or variations of the specific embodiments discussed herein.

What is claimed is:

1. A sense amplifier of a memory cell, comprising:
   a sense voltage generating circuit configured to generate a sense voltage; and
   a sensing circuit comprising circuit elements configured to form a current sensing path indicating a content of the memory cell, compare a bitline voltage of the memory cell with the sense voltage, and output a digital output signal indicating the content of the memory cell, wherein the sensing circuit comprises:
      a voltage detector coupled between the bitline of the memory cell and the output of the sensing circuit; and
      a current source coupled between the out put of the sensing circuit and voltage source, and
   wherein during a sense phase:
      the voltage detector is configured to discharge the bitline capacitance of the memory cell to the output of the sensing circuit when the bitline voltage of the memory cell is greater than the sense voltage,
      the current source is configured to discharge the output of the sensing circuit to the voltage source when the bitline voltage of the memory cell is less than the sense voltage, and
      all the circuit elements of the sensing circuit are decoupled from a voltage supply which charges a bitline capacitance during a precharge phase, and are coupled to and supplied by the bitline capacitance.

2. A memory array comprising the memory cell coupled to the sense amplifier of claim 1.

3. The memory array of claim 2, further comprising a switch coupled between the voltage supply and the bitline, wherein during the precharge phase the switch is closed, and during the sense phase the switch is open.

4. The sense amplifier of claim 1, wherein the sense voltage generating circuit is further configured to generate the sense voltage being dependent on a voltage supply during the precharge phase, and being independent of the voltage supply during the sense phase.

5. A sense amplifier of a memory cell, comprising:
   a sense voltage generating circuit configured to generate a sense voltage that is dependent on a voltage supply, which during a precharge phase charges a bitline capacitance of the memory cell, and during a sense phase is independent of the voltage supply; and
   a sensing circuit comprising circuit elements configured to form a current sensing path indicating a content of the memory cell, compare a bitline voltage with the sense voltage, and output a digital output signal indicating the content of the memory cell, wherein the sensing circuit comprises:
a voltage detector coupled between the bitline of the memory cell and the output of the sensing circuit; and
a current source coupled between the output of the sensing circuit and the voltage source, and
wherein during the sense phase:
the voltage detector is configured to discharge the bitline capacitance of the memory cell to the output of the sensing circuit when the bitline voltage of the memory cell is greater than the sense voltage,
the current source is configured discharge the output of the sensing circuit to the voltage source when the bitline voltage of the memory cell is less than the sense voltage, and
all circuit elements of the sensing circuit are decoupled from the voltage supply.

6. A sense amplifier of a memory cell, comprising:
a sense voltage generating circuit configured to generate a sense voltage that is dependent on a voltage supply, which during a precharge phase charges a bitline capacitance of the memory cell, and during a sense phase is independent of the voltage supply; and
a sensing circuit comprising circuit elements configured to form a current sensing path indicating a content of the memory cell, compare a bitline voltage with the sense voltage, and output a digital output signal indicating the content of the memory cell, wherein the sensing circuit comprises:
a voltage detector couple between the bitline of the memory cell and the output of the sensing circuit, wherein the voltage detector is a p-channel metal oxide semiconductor field effect transistor(PMOS); and
a current source coupled between the output of the sensing circuit and voltage source, wherein the current source is an n-channel metal oxide semiconductor field effect transistor (NMOS),
wherein the sense voltage generating circuit comprises:
a first switch coupled between the bitline of the memory cell and the source of the PMOS;
a second switch coupled between the voltage supply and the source of the PMOS; and
a third switch coupled between the gate of the PMOS and the drain of the PMOS, and
wherein during the sense phase, all circuit elements of the sensing circuit are decoupled from the voltage supply.

7. The sense amplifier of the claim 6, wherein during the precharge phase, the first switch is configured to be open and the second and third switches are configured to be closed, such that the sense voltage is dependent on the voltage supply.

8. The sense amplifier of the claim 6, wherein during the sense phase, the first switch is configured to be closed and the second and third switches are configured to be open, such that the sense voltage is independent of the voltage supply.

9. The sense amplifier of the claim 6, wherein the sense voltage generating circuit further comprises:
a sense resistor coupled between the voltage supply and the second switch; and
a sample capacitor coupled between the gate of the PMOS and a stable voltage source, and during the sense phase is configured to apply a voltage to the gate of the PMOS.

10. A memory array comprising the memory cell coupled to the sense amplifier of claim 5.

11. The memory array of claim 10, further comprising a switch coupled between the voltage supply and the bitline, wherein during the precharge phase the switch is closed, and during the sense phase the switch is open.

12. A method of a sense amplifier reading a memory cell, the method comprising:
charging, during a precharge phase, a bitline capacitance of the memory cell by a voltage supply;
decoupling, during a sense phase, all circuit elements of a sensing circuit configured to form a current sensing path indicating a content of the memory cell, from the voltage supply,
generating, by a sense voltage generating circuit, the sense voltage, wherein the sense voltage is dependent on the voltage supply during the precharge phase and is independent of the voltage supply during the sense phase;
comparing, by the sensing circuit, a bitline voltage with a sense voltage;
outputting, at the output of the sensing circuit, a digital output signal indicating the content of the memory cell, out
wherein during the sense phase:
keeping the circuit elements of the sensing circuit coupled to the bitline and supplied by the bitline capacitance,
charging from the bitline capacitance, by the voltage supply, the output of the sensing circuit when the bitline voltage of the memory cell is greater than the sense voltage, and
discharging, by the current source, the output of the sensing circuit to a voltage source when the bitline voltage of the memory cell is less than the sense voltage.

* * * * *

UNITED STATES PATENT AND TRADEMARK OFFICE
CERTIFICATE OF CORRECTION

PATENT NO. : 9,460,759 B2
APPLICATION NO. : 14/149353
DATED : October 4, 2016
INVENTOR(S) : Thomas Kern et al.

It is certified that error appears in the above-identified patent and that said Letters Patent is hereby corrected as shown below:

In the Claims

At Column 6, Claim number 1, Line number 33, "out put" should read --output--

Signed and Sealed this
Fourth Day of April, 2017

Michelle K. Lee
*Director of the United States Patent and Trademark Office*